(12) United States Patent
Yamauchi et al.

(10) Patent No.: US 8,035,187 B2
(45) Date of Patent: Oct. 11, 2011

(54) SEMICONDUCTOR LIGHT RECEIVING ELEMENT AND OPTICAL COMMUNICATION SYSTEM

(75) Inventors: Yoshinori Yamauchi, Tokyo (JP); Takahiro Arakida, Kanagawa (JP); Rintaro Koda, Tokyo (JP); Norihiko Yamaguchi, Kanagawa (JP); Yuji Masui, Kanagawa (JP); Tomoyuki Oki, Miyagi (JP)

(73) Assignee: Sony Corporation, Tokyo (JP)

( * ) Notice: Subject to any disclaimer, the term of this patent is extended or adjusted under 35 U.S.C. 154(b) by 235 days.

(21) Appl. No.: 12/362,066

(22) Filed: Jan. 29, 2009

(65) Prior Publication Data

US 2009/0194837 A1 Aug. 6, 2009

(30) Foreign Application Priority Data

Feb. 6, 2008 (JP) .................................. 2008-026355

(51) Int. Cl.
*H01L 31/00* (2006.01)
(52) U.S. Cl. .......................................... 257/466; 257/57
(58) Field of Classification Search .................... 257/466
See application file for complete search history.

(56) References Cited

U.S. PATENT DOCUMENTS

| | | | |
|---|---|---|---|
| 2004/0016932 A1* | 1/2004 | Kondo | 257/80 |
| 2005/0029530 A1* | 2/2005 | Ouchi | 257/79 |

FOREIGN PATENT DOCUMENTS

| | | | |
|---|---|---|---|
| JP | SHO 63-038277 A | 2/1988 |
| JP | 01-239973 | 9/1989 |
| JP | HEI 04-137565 A | 5/1992 |
| JP | HEI 05-021829 A | 1/1993 |
| JP | HEI 05-029642 A | 2/1993 |
| JP | 05-206497 | 8/1993 |
| JP | HEI 05-291606 A | 11/1993 |
| JP | HEI 11-274545 A | 10/1999 |
| JP | HEI 11-330531 A | 11/1999 |
| JP | 2000-269586 A | 9/2000 |
| JP | 2002-217481 A | 8/2002 |

OTHER PUBLICATIONS

Japanese Patent Office, Office Action issued in Patent Application JP 2008-026355, on Jan. 20, 2010.

* cited by examiner

*Primary Examiner* — Phuc Dang
(74) *Attorney, Agent, or Firm* — SNR Denton US LLP

(57) ABSTRACT

The present invention provides a semiconductor light receiving element capable of reducing capacity while minimizing increase in travel time of carriers. The semiconductor light receiving element includes a semiconductor stacked structure including a first conductivity type layer, a light absorbing layer, and a second conductivity type layer having a light incidence plane in order. The semiconductor light receiving element has an oxidation layer including a non-oxidation region and an oxidation region in a stacking in-plane direction in the light absorbing layer or between the first conductivity type layer and the light absorbing layer.

7 Claims, 4 Drawing Sheets

SEMICONDUCTOR LIGHT RECEIVING ELEMENT AND OPTICAL COMMUNICATION SYSTEM

CROSS REFERENCES TO RELATED APPLICATIONS

The present invention contains subject matter related to Japanese Patent Application JP 2008-026355 filed in the Japanese Patent Office on Feb. 6, 2008, the entire contents of which being incorporated herein by reference.

BACKGROUND OF THE INVENTION

1. Field of the Invention

The present invention relates to a semiconductor light receiving element suitably applicable to optical communication and a method of manufacturing the same, and an optical communication system including the semiconductor light receiving element.

2. Description of the Related Art

In general, in a PIN photodiode (p-intrinsic-n photodiode) for optical communication, a columnar mesa is formed by stacking an n-type buffer layer, a light absorbing layer, and a p-type cap layer on an n-type semiconductor substrate, for example, as described in Japanese Unexamined Patent Publication No. Hei 1-239973. On the upper surface of the mesa, a ring-shaped upper electrode having an opening in a light incidence region is provided, and on the rear surface of the n-type semiconductor substrate, a lower electrode is provided. In a PIN photodiode having such a configuration, when light enters into the light incidence region on the condition that a reverse-bias voltage is applied between the upper electrode and the lower electrode, the light is converted into photocurrent in the light absorbing layer, and the converted photocurrent is outputted as an optical output signal from the upper electrode and the lower electrode.

To realize high-capacity communication in PIN photodiodes for optical communication, high-speed response is desired. The response speed is basically limited by CR time constant and travel time of carriers in the light absorbing layer. In the CR time constant, the light absorbing layer is preferably thick to reduce the capacity, but in the travel time of carriers, the light absorbing layer is preferably thin. To efficiently convert light entering to the light incidence region into photocurrent, an area in a stacking in-plane direction of the light absorbing layer is preferably large. In this case, however, it causes an increase in capacity. In other words, to realize the high-speed response, it is necessary to optimize these parameters.

In Japanese Unexamined Patent Publication No. Hei 1-239973, measures are indicated that, to improve CR time constant, a low dielectric constant layer is provided adjacent to a mesa, and an extraction electrode connected to an upper electrode on the upper surface of the mesa is formed on the upper surface of the low dielectric constant layer, thereby reducing capacity between the extraction electrode and a lower electrode. In Japanese Patent No. 3183931, measures are indicated that a buffer layer is lightly-doped, thereby reducing capacity between an upper electrode and a lower electrode.

SUMMARY OF THE INVENTION

However, in Japanese Unexamined Patent Publication No. Hei 1-239973, there is an issue that the capacity between the upper electrode and the lower electrode is not reduced and still large. In Japanese Patent No. 3183931, there is an issue that, to sufficiently reduce the capacity between the upper electrode and the lower electrode, the thickness of a buffer layer is necessarily at the same level as that of the light absorbing layer, but this causes an increase in travel time of carriers.

In view of the foregoing, it is desirable to provide a semiconductor light receiving element capable of reducing capacity while minimizing an increase in travel time of carriers and a method of manufacturing the semiconductor light receiving element, and an optical communication system.

According to an embodiment of the present invention, there is provided a semiconductor light receiving element including a semiconductor stacked structure including a first conductivity type layer, a light absorbing layer, and a second conductivity type layer having a light incidence plane in order. The semiconductor light receiving element is provided with an oxidation layer including a non-oxidation region and an oxidation region in a stacking in-plane direction in the light absorbing layer or between the first conductivity type layer and the light absorbing layer.

According to an embodiment of the present invention, there is provided an optical communication system using the above-mentioned semiconductor light receiving element.

In the semiconductor light receiving element and the optical communication system according to an embodiment of the present invention, an oxidation layer including a non-oxidation region and an oxidation region in a stacking in-plane direction is provided in a light absorbing layer or between a first conductivity type layer and a light absorbing layer. Therefore, it is possible that a dielectric constant of the oxidation region in the oxidation layer is sufficiently lower than the dielectric constant of the light absorbing layer.

According to an embodiment of the present invention, there is provided a method of manufacturing a semiconductor light receiving element including the steps (1) to (3) as follows:

(1) forming a semiconductor stacked structure including a first conductivity type layer, a light absorbing layer, and a second conductivity type layer having a light incidence plane in order, and including, in the light absorbing layer or between the first conductivity type layer and the light absorbing layer, a layer to be oxidized which is made of material more easily oxidized than that of the light absorbing layer;

(2) selectively etching the semiconductor stacked structure, thereby forming a mesa in which at least the layer to be oxidized is exposed from a side face of the mes; and (3) oxidizing the layer to be oxidized from the side face, thereby forming an oxidation region in an outer edge of the layer to be oxidized, and forming a non-oxidation region in a portion surrounded by the oxidation region in the layer to be oxidized.

In the method of manufacturing the semiconductor light receiving element according to an embodiment of the present invention, the layer to be oxidized provided in the light absorbing layer or between the first conductivity type layer and the light absorbing layer is oxidized from the side face, thereby forming the oxidation region in the outer edge of the layer to be oxidized. Therefore, it is possible that the dielectric constant of the oxidation region in the layer to be oxidized is sufficiently lower than the dielectric constant of the light absorbing layer.

In the semiconductor light receiving element and the method of manufacturing the semiconductor light receiving element, and the optical communication system according to an embodiment of the present invention, an oxidation layer including a non-oxidation region and an oxidation region in a stacking in-plane direction is provided in a light absorbing layer or between a first conductivity type layer and a light absorbing layer. Therefore, it is possible that capacity is sufficiently reduced without thickening the oxidation region. This enables increase in travel time of carriers to be minimized. In this way, in the present invention, the capacity may be reduced while minimizing the increase in travel time of carriers.

Other and further objects, features and advantages of the invention will appear more fully from the following description.

DETAILED DESCRIPTION OF THE PREFERRED EMBODIMENT

Figure 1:
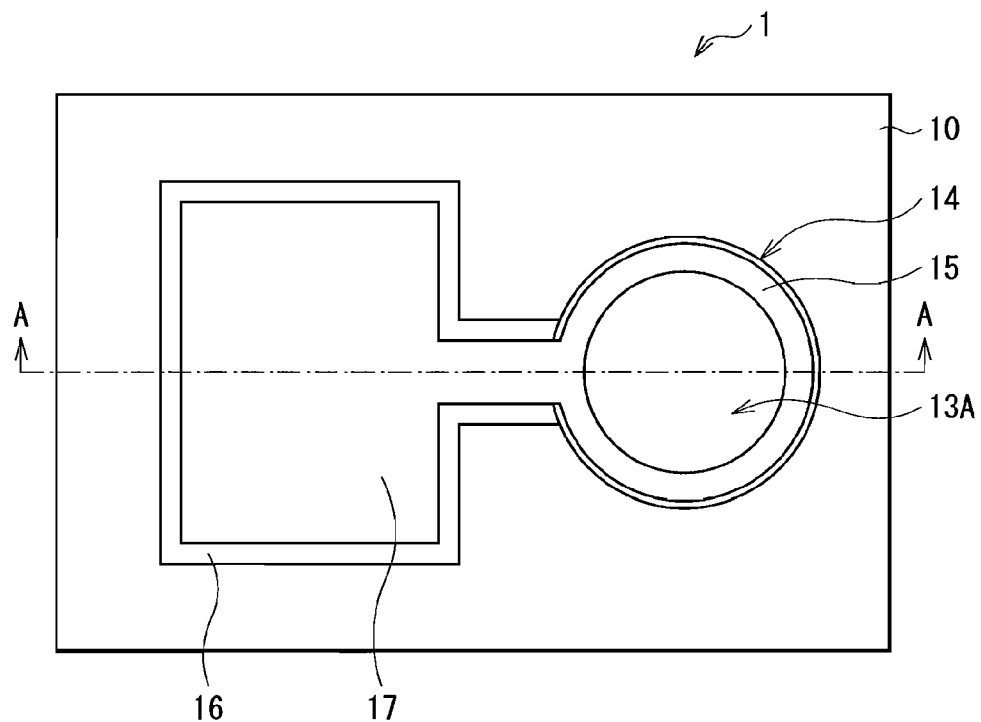
FIG. 1 is a top view of a semiconductor light receiving element according to an embodiment of the present invention.
Figure 2:
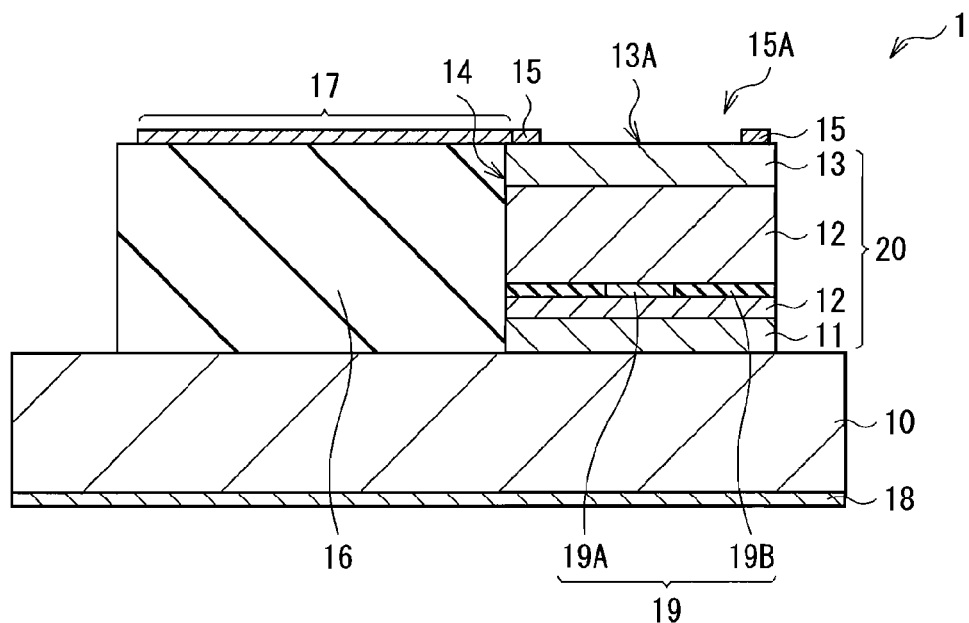
FIG. 2 is a cross-sectional view illustrating an example of the cross-sectional configuration as viewed from the direction of arrow A-A of the semiconductor light receiving element of FIG. 1.
Figure 3:
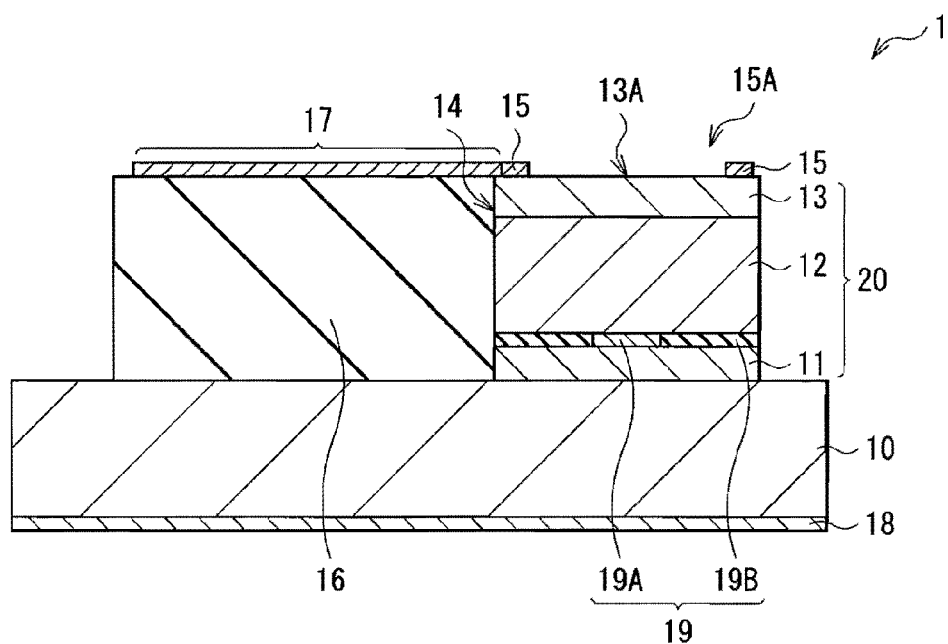
FIG. 3 is a cross-sectional view illustrating another example of the cross-sectional configuration as viewed from the direction of arrow A-A of the semiconductor light receiving element of FIG. 1.

A preferred embodiment of the present invention will be described in detail with reference to the accompanying drawings. FIG. 1 illustrates a top view of a surface-emitting semiconductor light receiving element 1 according to an embodiment of the present invention. FIGS. 2 and 3 illustrate examples of the cross-sectional configuration as viewed from the direction of arrow A-A of the semiconductor light receiving element 1 of FIG. 1, respectively. FIGS. 1 to 3 are schematic views with dimensions and shapes different from actual dimensions and actual shapes.

The semiconductor light receiving element 1 is suitably applicable to an optical communication system performing signal transmission (optical transmission) between semiconductor chips such as LSIs, and includes, on a semiconductor substrate 10, a stacked structure 20 including a first conductivity type layer 11, a light absorbing layer 12, and a second conductivity type layer 13 in this order from the semiconductor substrate 10 side. In the stacked structure 20, a columnar mesa 14 is formed over the whole or the part of the first conductivity type layer 11, the light absorbing layer 12, and the second conductivity type layer 13, and an upper electrode 15 is formed on an upper surface of the mesa 14. The upper electrode 15 has an opening 15A in a region facing a light incidence plane 13A of the second conductivity type layer 13, and has a ring shape. Moreover, a low dielectric constant section 16 is formed in contact with a side face of the stacked structure 20. The upper surface of the low dielectric constant section 16 is formed in the almost-same plane as the upper surface of the stacked structure 20. On the upper surface of the low dielectric constant section 16, an extraction electrode 17 electrically connected to the upper electrode 15 is formed. Over the whole rear surface of the semiconductor substrate 10, a lower electrode 18 is formed.

Here, the semiconductor substrate 10 is, for example, made of an n-type GaAs substrate with a {100} plane (for example, a (100) plane) as a main surface. As n-type impurities, for example, silicon (Si), selenium (Se), and the like are cited. The first conductivity type layer 11 is, for example, made of p-type GaAs.

The light absorbing layer 12 absorbs light entering into the light incidence plane 13A, and converts the light into an electrical signal (photocurrent) in accordance with the output level of the absorbed light. The light absorbing layer 12 is, for example, made of undoped GaAs or InGaAs. The electrical signal generated in the light absorbing layer 12 is inputted as an optical communication signal to an optical communication arithmetic circuit (not illustrated in the figure) connected to the extraction electrode 17 and the lower electrode 18, and is used to determine the signal level of the light entering into the light incidence plane 13A in the optical communication arithmetic circuit.

The second conductivity type layer 13 is made of a semiconductor with a conductivity type different from that of the first conductivity type layer 11, for example, p-type AlGaAs. As p-type impurities, zinc (Zn), magnesium (Mg), beryllium (Be), and the like are cited. Accordingly, the stacked structure 20 has a sandwich structure (PIN structure) in which the light absorbing layer 12 is sandwiched by semiconductor layers having conductivity types different from each other.

Each of the upper electrode 15 and the extraction electrode 17 has a structure by stacking, for example, titanium (Ti), platinum (Pt), and gold (Au) in this order from the semiconductor substrate 10 side, and is electrically connected to the upper surface of the stacked structure 20 (second conductivity type layer 13). The lower electrode 18 has a structure by stacking, for example, an alloy of gold (Au) and germanium (Ge), nickel (Ni), and gold (Au) in this order from the semiconductor substrate 10 side, and is electrically connected to the semiconductor substrate 10. The low dielectric constant section 16 reduces the capacity between the extraction electrode 17 and the lower electrode 18, and prevents step disconnection in the upper electrode 15 and the extraction electrode 17. The low dielectric constant section 16 is made of, for example, insulating material such as polyimide, silicon oxide ($SiO_2$) and silicon nitride (SiN).

As illustrated in FIGS. 2 and 3, in the embodiment, the semiconductor light receiving element 1 includes an oxidation layer 19 in the light absorbing layer 12 or between the first conductivity type layer 11 (the conductivity type semiconductor layer on a side opposite from the light incidence plane 13A) and the light absorbing layer 12. The oxidation layer 19 includes a non-oxidation region 19A and an oxidation region 19B in a stacking in-plane direction. The oxidation layer 19 is provided on a side opposite from the light incidence plane 13A relative to the light absorbing layer 12, thereby preventing that absorption of light entering from the light incidence plane 13A into the light absorbing layer 12 is disturbed by the oxidation layer 19.

The non-oxidation region 19A is provided in a region facing the light incidence plane 13A, and preferably provided in the center of the region facing the light incidence plane 13A. When a layer to be oxidized 19D is oxidized from a side face thereof, the non-oxidation layer 19A corresponds to a region remained without being oxidized, and is made of the same material as the layer to be oxidized 19D, for example, material of the light absorbing layer 12, which contains Al (for example, n-type AlGaAs or n-type InGaAlAs). The oxidation region 19B is provided in the surrounding area of the non-oxidation region 19A, and has a ring shape. When the layer to be oxidized 19D is oxidized from a side face thereof, the oxidation region 19B corresponds to a region which is oxidized, and is an insulating region which contains, for example, $Al_2O_3$.

Next, an example of a method of manufacturing the semiconductor light receiving element 1 according to the embodiment will be described.

Figure 4:
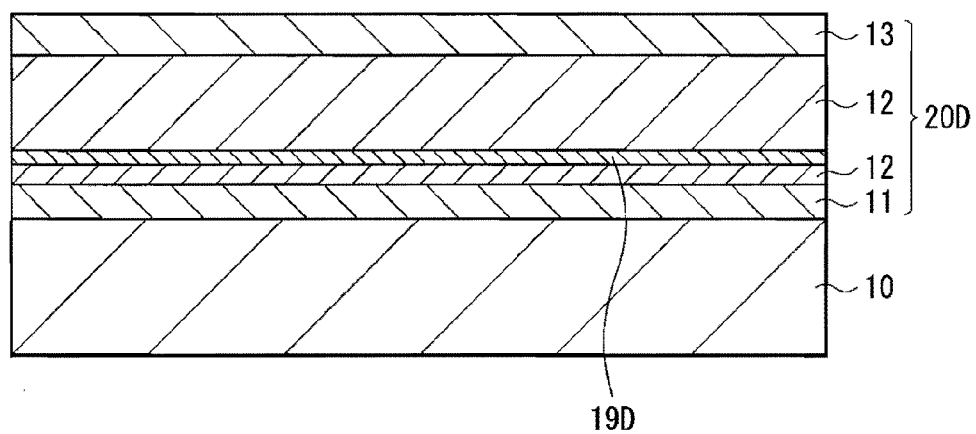
FIG. 4 is a cross-sectional view for explaining a method of manufacturing the semiconductor light receiving element of FIG. 1.
Figure 5:
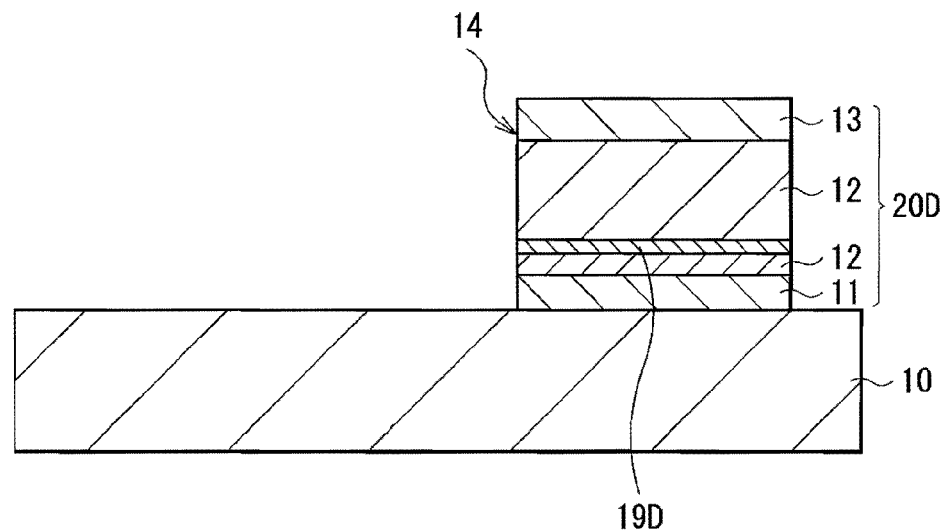
FIG. 5 is a cross-sectional view for explaining a step following FIG. 4.
Figure 6:
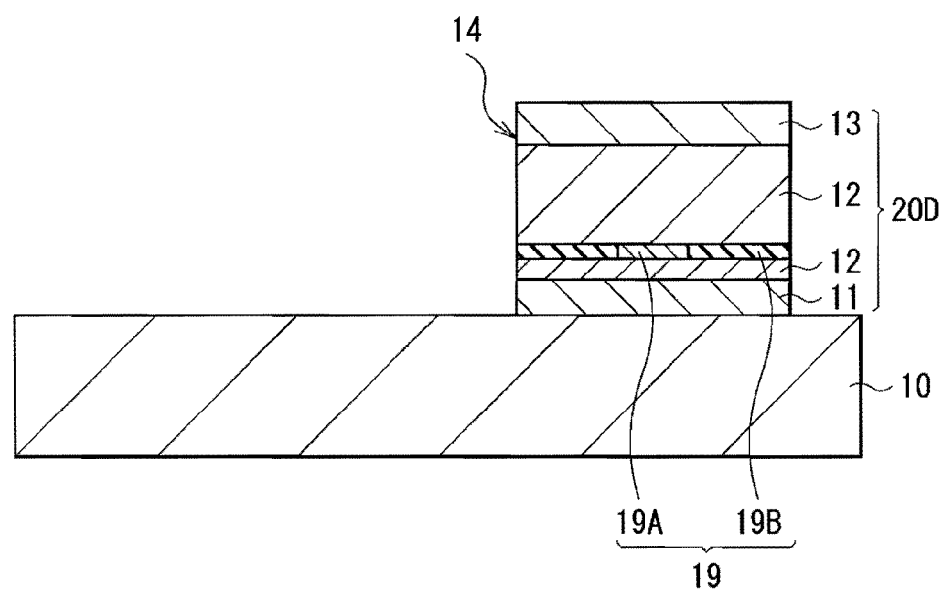
FIG. 6 is a cross-sectional view for explaining a step following FIG. 5.

FIGS. 4 to 6 illustrate cross-sectional configurations in each step of the manufacturing process of the semiconductor light receiving element 1 according to the embodiment. In manufacture of the semiconductor light receiving element 1, for example, a GaAs-based compound semiconductor is collectively formed on the semiconductor substrate 10 of GaAs with a (100) plane as a main surface by epitaxial crystal growth method such as MOCVD (metal organic chemical vapor deposition). At this time, as material for the GaAs-based compound semiconductor, for example, methyl-based organic metal gas such as trimethylaluminum (TMAl), trimethylgallium (TMGa), trimethylindium (TMIn), and arsine ($AsH_3$) is used. As donor impurities, for example, hydrogen selenide ($H_2Se$) is used. As material for acceptor impurities, for example, dimethylzinc (DMZn) is used.

Specifically, as illustrated in FIG. 4, a stacked structure 20D including, on the semiconductor substrate 10, the first conductivity type layer 11, the light absorbing layer 12, and the second conductivity type layer 13 in this order from the semiconductor substrate 10 side, and including, in the light absorbing layer 12 or between the first conductivity type layer 11 and the light absorbing layer 12, the layer to be oxidized 19D of material which is more easily oxidized than that of the light absorbing layer 12 is formed.

Next, as illustrated in FIG. 5, after a circular resist layer (not illustrated in the figure) is formed, the stacked structure 20D is selectively etched while using the resist layer as a mask. Thereby, the columnar mesa 14 in which at least the layer to be oxidized 19D is exposed from the side face of the mesa 14 is formed just below the resist layer.

Next, as illustrated in FIG. 6, oxidation is performed at a high temperature in a water vapor atmosphere, and the layer to be oxidized 19D is selectively oxidized from the side face of the mesa 14. Thereby, an outer edge region of the layer to be oxidized 19D becomes an insulating layer (aluminum oxide). Accordingly, the oxidation region 19B is formed in the outer edge region, and the non-oxidation region 19A is formed in the central region. In this way, the oxidation layer 19 is formed.

Next, as illustrated in FIG. 2, after the low dielectric constant section 16 in contact with the side face of the mesa 14 is formed, the upper electrode 15 is formed on the upper surface of the mesa 14 and the extraction electrode 17 is formed on the upper surface of the low dielectric constant section 16. Moreover, the lower electrode 18 is formed on the rear surface of the semiconductor substrate 10. In this way, the semiconductor light receiving element 1 according to the embodiment is manufactured.

In the semiconductor light receiving element 1 according to the embodiment, for example, the lower electrode 18 is regarded as a ground electrode of the semiconductor light receiving element 1. When a reverse bias is applied to the semiconductor light receiving element 1 from the upper electrode 15 and then light enters into the light incidence plane 13A of the semiconductor light receiving element 1, the light entering into the light incidence plane 13A is absorbed in the light absorbing layer 12, and converted into an electrical signal (photocurrent) in accordance with the output level of the absorbed light. After that, the electrical signal is outputted to an LSI chip or the like via the upper electrode 15 and the lower electrode 18.

In the embodiment, as illustrated in FIGS. 2 and 3, the oxidation layer 19 including the non-oxidation region 19A and the oxidation region 19B in the stacking in-plane direction is provided in the light absorbing layer 12 or between the first conductivity type layer 11 (the conductivity type semiconductor layer on a side opposite from the light incidence plane 13A) and the light absorbing layer 12.

Here, for example, in the case where the non-oxidation 19A is made of AlGaAs (dielectric constant from 10.06 to 12.90), the oxidation region 19B contains $Al_2O_3$ (dielectric constant 9), and the light absorbing layer 12 is made of undoped GaAs (dielectric constant 12.9), that is, in the case where the dielectric constant of the oxidation region 19B is smaller than those of the other layers (the first conductivity type layer 11, the light absorbing layer 12, and the second conductivity type layer 13), when the ratio of the oxidation region 19B to the oxidation layer 19 is sufficiently larger than that of the non-oxidation region 19A to the oxidation layer 19, the capacity between the upper electrode 15 and the lower electrode 18 may be reduced in comparison with the case where the oxidation layer 19 is not provided. Because the dielectric constant (9) of the oxidation region 19B is remarkably smaller than the dielectric constant (12.9) of the light absorbing layer 12, the capacity between the upper electrode 15 and the lower electrode 18 may be sufficiently reduced without thickening the oxidation layer 19. Moreover, even if the oxidation layer 19 is thin, the capacity between the upper electrode 15 and the lower electrode 18 may be sufficiently reduced. Thus, the increase in travel time of carriers may be minimized by thinning the oxidation layer 19. In this way, in the embodiment, the capacity may be reduced while minimizing the increase in travel time of carriers.

In Japanese Patent No. 3183931, the use of a lightly-doped InP layer between electrodes in a semiconductor light receiving element is introduced. However, the dielectric constant of InP is 12.5, and this is remarkably larger than the dielectric constant of $Al_2O_3$ and just slightly smaller than the dielectric constant of GaAs, as exemplified in the embodiment. Accordingly, in Japanese Patent No. 3183931, the thickness of an InP layer is necessarily at the same level as that of a light absorbing layer. Otherwise, the capacity is not sufficiently reduced, and in such a case, the travel time of carriers remarkably increases.

Application

Next, the case where the semiconductor light receiving element 1 of the above embodiment is applied to an optical communication system 2 will be described.

Figure 7:
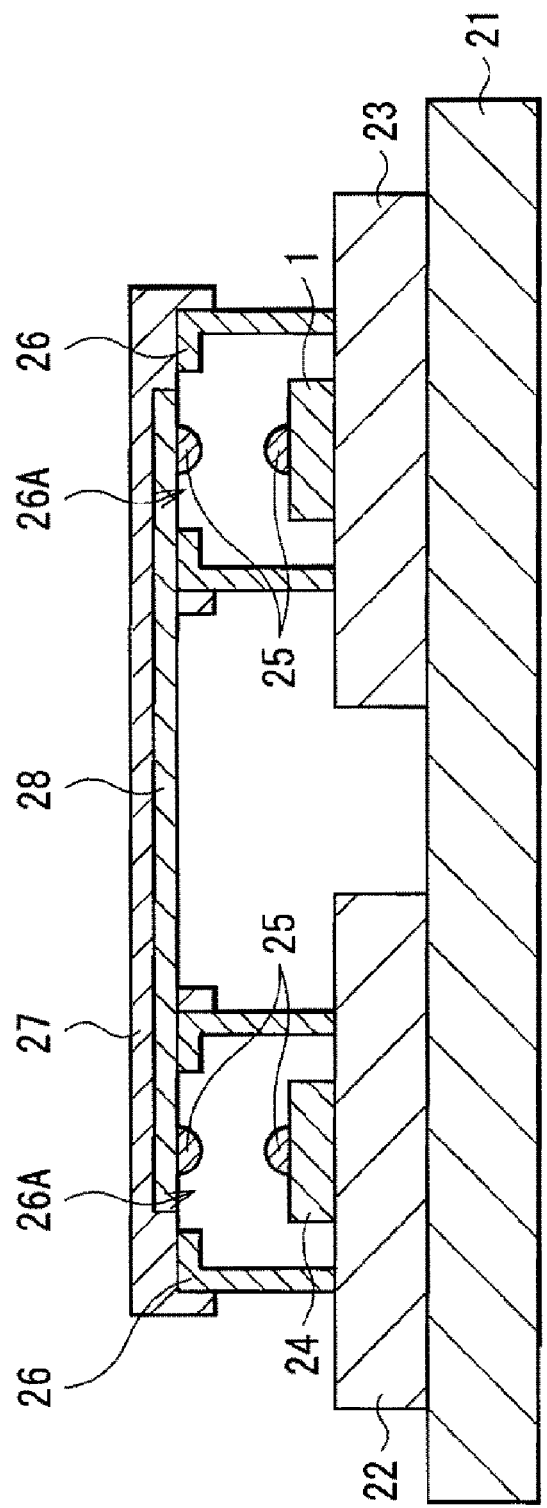
FIG. 7 is a cross-sectional configuration view of an optical communication system according to an application.

FIG. 7 illustrates an example of the cross-sectional configuration of the optical communication system 2 according to an application. In the optical communication system 2, two LSI chips 22 and 23 are mounted on a printed wiring board 21. On the surface of the LSI chip 22 as one of the two LSI chips, a semiconductor light receiving element 24 such as a laser diode is disposed. An electrical signal from the LSI chip 22 is converted into an optical signal by the semiconductor light receiving element 24, and the optical signal is outputted from the semiconductor light receiving element 24. On the surface of the LSI chip 23 as the other of the two LSI chips, a semiconductor light receiving element 1 according to the embodiment is disposed. An optical signal inputted to the semiconductor light receiving element 1 is converted into an electrical signal in the semiconductor light receiving element 1, and the electrical signal is inputted to the LSI chip 23.

Lenses 25 are provided on a light emission plane of the semiconductor light receiving element 24, a light incidence plane 13A of the semiconductor light receiving element 1, and both ends of a light waveguide 28. The lens 25 is, for example, a collimating lens for collimating a diverging light and collecting a collimated light. On the upper surface of the LSI chips 22 and 23, tubular-shaped male connectors 26 covering the semiconductor light receiving element 24 and the semiconductor light receiving element 1 are provided. On the upper surface of each male connector 26, an opening 26A is provided, and a female connector 27 sealing the opening 26A and fitting onto the male connector 26 is provided. The female connector 27 is disposed along the light waveguide 28, and also has a function to support the light waveguide 28.

In the application, when the male connector 26 and the female connector 27 are connected to each other, and then the semiconductor light receiving element 24 is driven, light is emitted from the semiconductor light receiving element 24, and the light enters into one end of the light waveguide 28 via the lens 25. The light entering into the light waveguide 28 is guided through the light waveguide 28, and then outputted from the other end of the light waveguide 28. After that, the light enters into the semiconductor light receiving element 1 via the lens 25. The light entering into the semiconductor light receiving element 1 is absorbed in the light absorbing layer 12, and converted into an electrical signal (photocurrent) in accordance with the output level of the absorbed light. After that, the electrical signal is outputted to the LSI chip 22 via the upper electrode 15 and the lower electrode 18.

In the application, as illustrated in FIGS. 2 and 3, the oxidation layer 19 including the non-oxidation region 19A and the oxidation region 19B in the stacking in-plane direction is provided in the light absorbing layer 12 or between the first conductivity type layer 11 (the conductivity type semiconductor layer on a side opposite from the light incidence plane 13A) and the light absorbing layer 12 in the semiconductor light receiving element 1. Thereby, it is possible that the capacity is reduced while minimizing the increase in travel time of carriers, in comparison with the case where the oxidation layer 19 is not provided in the light absorbing layer 12 of the semiconductor light receiving element 1. Therefore, the high-speed response is enabled and the high-capacity communication is realized.

Hereinbefore, the present invention has been described with the embodiment and the modification. However the present invention is not limited to the above embodiment and may be variously modified.

For example, in the above embodiment, the first conductivity type layer 11 is provided in the stacked structure 20. However, in the case where the conductivity type of the semiconductor substrate 10 is the same as that of the first conductivity type layer 11, the first conductivity type layer 11 may be optionally omitted.

In the above embodiment, the case where the semiconductor material is composed of a GaAs-based compound semiconductor has been described. However, the semiconductor material may be composed of other material systems such as GaInP-based (red) material, AlGaAs-based (infrared) material, GaN-based (blue-green) material, or the like.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor light receiving element comprising:
   a semiconductor stacked structure including a first conductivity type layer, a light absorbing layer on the first conductivity type layer, and a second conductivity type layer on the light absorbing layer stacked in that order; and
   an oxidation layer including a non-oxidation region and an oxidation region in a stacking in-plane direction in the light absorbing layer or between the first conductivity type layer and the light absorbing layer.

2. The semiconductor light receiving element according to claim 1, wherein a dielectric constant of the oxidation region is smaller than the dielectric constant of the light absorbing layer.

3. The semiconductor light receiving element according to claim 1, wherein the non-oxidation region is provided in a region facing the light incidence plane.

4. The semiconductor light receiving element according to claim 1, wherein the non-oxidation region is provided in a center of the region facing the light incidence plane.

5. The semiconductor light receiving element according to claim 1, wherein the semiconductor stacked structure has a mesa in which at least the oxidation layer is exposed from a side face of the mesa.

6. The semiconductor light receiving element according to claim 5 comprising:
   a low dielectric constant section provided in contact with the side face of the mesa; and
   an electrode provided over an upper surface of the low dielectric constant section and an upper surface of the semiconductor stacked structure.

7. An optical communication system using a semiconductor light receiving element, the semiconductor light receiving element including:
   a semiconductor stacked structure including a first conductivity type layer, a light absorbing layer on the fist conductivity type layer, and a second conductivity type layer having a light incidence plane stacked in that order, and
   an oxidation layer including a non-oxidation region and an oxidation region in a stacking in-plane direction in the light absorbing layer or between the first conductivity type layer and the light absorbing layer; and
   a dielectric constant of the oxidation region is lower than the dielectric constant of the light absorbing layer.

* * * * *